(12) United States Patent
Bae et al.

(10) Patent No.: US 9,343,439 B2
(45) Date of Patent: May 17, 2016

(54) STACK PACKAGES AND METHODS OF MANUFACTURING THE SAME

(71) Applicant: SK hynix Inc., Icheon-si Gyeonggi-do (KR)

(72) Inventors: Jin Ho Bae, Icheon-si (KR); Han Jun Bae, Icheon-si (KR)

(73) Assignee: SK Hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/884,864

(22) Filed: Oct. 16, 2015

(65) Prior Publication Data

US 2016/0035708 A1 Feb. 4, 2016

Related U.S. Application Data

(62) Division of application No. 14/082,441, filed on Nov. 18, 2013, now Pat. No. 9,196,607.

(30) Foreign Application Priority Data

Jun. 11, 2013 (KR) .......................... 10-2013-0066493

(51) Int. Cl.
| | | |
|---|---|---|
| *H01L 23/48* | (2006.01) | |
| *H01L 25/065* | (2006.01) | |
| *H01L 25/18* | (2006.01) | |
| *H01L 23/00* | (2006.01) | |
| *H01L 25/00* | (2006.01) | |
| *H01L 23/31* | (2006.01) | |

(52) U.S. Cl.
CPC ............ *H01L 25/0657* (2013.01); *H01L 24/24* (2013.01); *H01L 24/49* (2013.01); *H01L 24/82* (2013.01); *H01L 24/92* (2013.01); *H01L 25/18* (2013.01); *H01L 25/50* (2013.01); *H01L 23/3121* (2013.01); *H01L 24/73* (2013.01); *H01L 2224/04042* (2013.01); *H01L 2224/05548* (2013.01); *H01L 2224/06135* (2013.01); *H01L 2224/24145* (2013.01); *H01L 2224/24146* (2013.01); *H01L 2224/32145* (2013.01); *H01L 2224/32225* (2013.01); *H01L 2224/45144* (2013.01); *H01L 2224/48091* (2013.01); *H01L 2224/48227* (2013.01); *H01L 2224/73215* (2013.01); *H01L 2224/73217* (2013.01); *H01L 2224/73227* (2013.01); *H01L 2224/73265* (2013.01); *H01L 2224/92135* (2013.01); *H01L 2224/92164* (2013.01); *H01L 2224/92244* (2013.01); *H01L 2224/92247* (2013.01); *H01L 2225/0651* (2013.01); *H01L 2225/06524* (2013.01); *H01L 2225/06551* (2013.01); *H01L 2225/06568* (2013.01); *H01L 2924/1434* (2013.01); *H01L 2924/181* (2013.01)

(58) Field of Classification Search
CPC ....... H01L 24/18; H01L 24/82; H01L 23/538; H01L 25/18
See application file for complete search history.

(56) References Cited

U.S. PATENT DOCUMENTS

2006/0258044 A1* 11/2006 Meyer .................... H01L 24/24
438/106

*Primary Examiner* — A. Sefer
(74) *Attorney, Agent, or Firm* — William Park & Associates Ltd.

(57) ABSTRACT

A stack package includes a substrate having connection terminals and a first chip on the substrate. The first chip has first connectors on edges thereof. A second chip is stacked on the first chip to expose outer portions of the first connectors. The second chip has second connectors on edges thereof. Connection members to connect the exposed outer portions of the first connectors to the connection terminals. Sidewall interconnectors to connect the exposed outer portions of the first connectors to the second connectors. The sidewall interconnectors extend from the exposed outer portions of the first connectors along sidewalls of the second chip to cover the second connectors.

9 Claims, 18 Drawing Sheets

STACK PACKAGES AND METHODS OF MANUFACTURING THE SAME

CROSS-REFERENCE TO RELATED APPLICATION

The present application is a Division of U.S. application Ser. No. 14/082,441, filed on Nov. 18, 2013, and the present application claims priority under 35 U.S.C 119(a) to Korean Application No. 10-2013-0066493, filed on Jun. 11, 2013, in the Korean intellectual property Office, which is incorporated herein by reference in its entirety as set forth in full.

BACKGROUND

1. Technical Field

Embodiments of the present disclosure generally relate to electronic device packages and, more particularly, to stack packages and methods of manufacturing the same.

2. Related Art

Electronic devices employed in electronic systems may include various electronic circuit elements, and the electronic circuit elements may be integrated in and/or on a semiconductor substrate to constitute the electronic device (also, referred to as a semiconductor chip or a semiconductor die). Memory semiconductor chips may also be employed in the electronic systems. Before the electronic devices including the memory semiconductor chips are employed in the electronic systems, the electronic devices may be encapsulated to have package forms. These electronic device packages may be employed in the electronic systems, for example, computers, mobile systems or data storage media.

As the mobile systems such as smart phones become lighter and smaller, semiconductor packages such as the electronic device packages employed in the mobile systems have been continuously scaled down. Stack packages each of which includes a plurality of stacked semiconductor chips are increasingly in demand with the development of multi-functional and large capacitive semiconductor packages. In this connection, many efforts to reduce the thickness and the size of the stack packages have been attempted to provide thin and small stack packages.

SUMMARY

According to an embodiment, a stack package includes a substrate having connection terminals and a first chip on the substrate. The first chip has first connectors on edges thereof. A second chip is stacked on the first chip to expose outer portions of the first connectors. The second chip has second connectors on edges thereof. Connection members to connect the exposed outer portions of the first connectors to the connection terminals. Sidewall interconnectors to connect the exposed outer portions of the first connectors to the second connectors. The sidewall interconnectors extend from the exposed outer portions of the first connectors along sidewalls of the second chip to cover the second connectors.

According to an embodiment, a stack package includes a substrate having bond fingers and a first chip on the substrate. The first chip has first connectors on edges thereof. A second chip is stacked on the first chip to expose outer portions of the first connectors. The second chip has second connectors on edges thereof. First metal wires electrically connect the exposed outer portions of the first connectors to the bond fingers. First sidewall interconnectors electrically connect the exposed outer portions of the first connectors to the second connectors. The first sidewall interconnectors vertically extend along sidewalls of the second chip. A third chip is stacked on the second chip to laterally protrude from the sidewalls of the second chip. The third chip has third connectors on edges thereof. A gap region is provided between the edges of the second chip and the edges of the third chip. Second metal wires electrically connect the third connectors to the bond fingers. The gap region provides a space in which the first metal wires are located.

According to an embodiment, a method of manufacturing a stack package includes stacking a first chip on a substrate including bond fingers. The first chip has first connectors on edges thereof. A second chip is stacked on the first chip such that outer portions of the first connectors are exposed. The second chip has second connectors on edges thereof. First metal wires are formed to electrically connect the exposed outer portions of the first connectors to the bond fingers. First sidewall interconnectors are formed to electrically connect the exposed outer portions of the first connectors to the second connectors. The first sidewall interconnectors are formed to vertically extend along sidewalls of the second chip.

According to an embodiment, a method of manufacturing a stack package includes stacking a first chip on a substrate including bond fingers. The first chip has first connectors on edges thereof. A preliminary second chip having preliminary second connectors is provided. The preliminary second connectors are disposed on edges of the preliminary second chip. The edges of the preliminary second chip are cut to remove outer portions of the preliminary second connectors and to form a second chip having second connectors. The second chip is stacked on the first chip such that outer portions of the first connectors are exposed. First metal wires are formed to electrically connect the exposed outer portions of the first connectors to the bond fingers. First sidewall interconnectors are formed to electrically connect the exposed outer portions of the first connectors to the second connectors. The first sidewall interconnectors are formed to vertically extend along sidewalls of the second chip.

According to an embodiment, a stack package includes a substrate having bond fingers and a first chip on the substrate. The first chip has first connectors on edges thereof. A second chip is stacked on the first chip to expose outer portions of the first connectors. The second chip has second connectors on edges thereof. A third chip is stacked on the second chip to expose outer portions of the second connectors. The third chip has third connectors on edges thereof. Metal wires electrically connect the exposed outer portions of the first connectors to the bond fingers. Sidewall interconnectors electrically connect the exposed outer portions of the first connectors to the second connectors and the third connectors.

According to an embodiment, an electronic system includes a memory; and a controller coupled with the memory through a bus, wherein the memory or the controller includes: a substrate having connection terminals and a first chip on the substrate. The first chip has first connectors on edges thereof. A second chip is stacked on the first chip to expose outer portions of the first connectors. The second chip has second connectors on edges thereof. Connection members to connect the exposed outer portions of the first connectors to the connection terminals. Sidewall interconnectors to connect the exposed outer portions of the first connectors to the second connectors. The sidewall interconnectors extend from the exposed outer portions of the first connectors along sidewalls of the second chip to cover the second connectors.

According to an embodiment, a memory card including: a memory; and a memory controller controlling an operation of the memory, wherein the memory includes: a substrate having connection terminals and a first chip on the substrate. The first chip has first connectors on edges thereof. A second chip is stacked on the first chip to expose outer portions of the first connectors. The second chip has second connectors on edges thereof. Connection members to connect the exposed outer portions of the first connectors to the connection terminals. Sidewall interconnectors to connect the exposed outer portions of the first connectors to the second connectors. The sidewall interconnectors extend from the exposed outer portions of the first connectors along sidewalls of the second chip to cover the second connectors.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Figure 1:
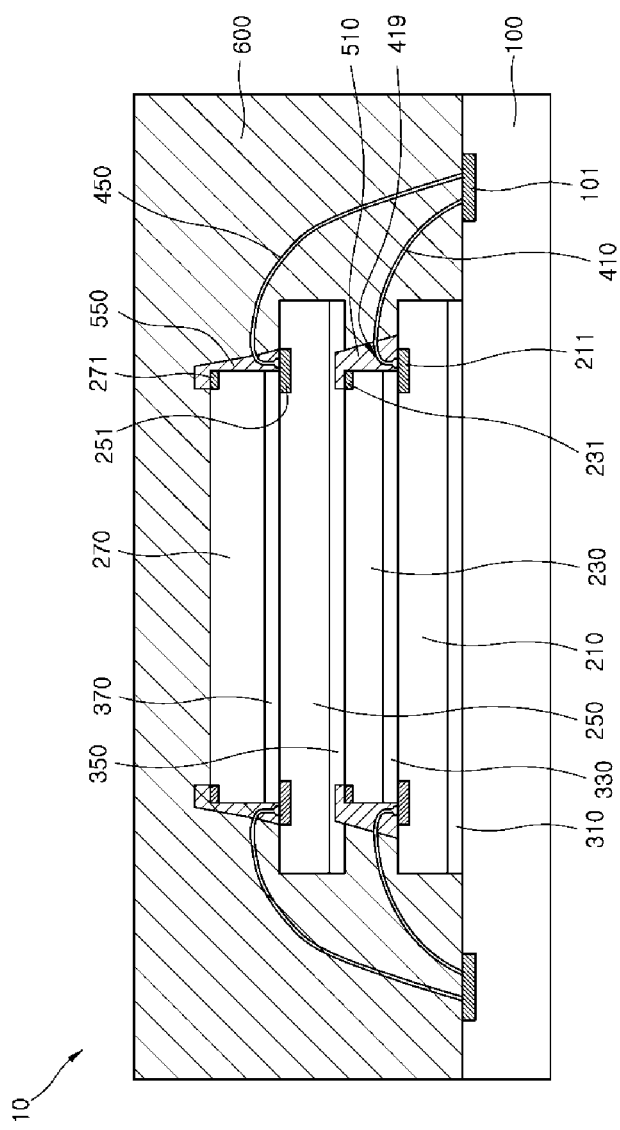
FIGS. 1 to 12 illustrate a stack package and a method of manufacturing a stack package according to an embodiment of the inventive concept.

It will be understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention.

It will also be understood that when an element is referred to as being "on", "above", "below" or "under" another element, it can be directly "on", "above", "below", or "under" the other element, respectively, or intervening elements may also be present. Accordingly, the terms such as "on", "above", "below", or "under" which are used herein are for the purpose of describing particular embodiments only and are not intended to limit the inventive concept.

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between", "adjacent" versus "directly adjacent", "on" versus "directly on").

Additionally, it will be understood that the term "chip" used herein may correspond to a semiconductor chip, for example, a memory chip, a semiconductor substrate, or a logic chip. The memory chip may include memory circuits such as dynamic random access memory (DRAM) circuits, static random access memory (SRAM) circuits, flash circuits, magnetic random access memory (MRAM) circuits, resistive random access memory (ReRAM) circuits, ferroelectric random access memory (FeRAM) circuits or phase change random access memory (PCRAM) circuits which are integrated on and/or in a substrate. The logic chip may include logic circuits which are integrated on and/or in a substrate. The semiconductor substrate may include the memory circuits or the logic circuits thereon and/or therein. In some cases, the term "chip" used herein may be construed as a die or a substrate in which integrated circuits are formed.

Wherever possible, the same reference numbers will be used throughout FIGS. 1-12 to refer to the same or like parts. Now referring to FIG. 1, a stack package 10 may be configured to include a package substrate 100 and a plurality of chips 210, 230, 250 and 270 sequentially stacked on a surface of the package substrate 100. The package substrate 100 may be a printed circuit board (PCB). In some embodiments, the package substrate 100 may be an interposer or an embedded substrate. The package substrate 100 may include connection terminals such as bond fingers 101 which are electrically connected to the chips 210, 230, 250 and 270 and are used as connectors. The stack package 10 may further include interconnection lines which are disposed in or on the package substrate 100 and are connected to the bond fingers 101. In some embodiments, the stack package 10 may further include outer connection terminals (not shown) that electrically connect the bond fingers 101 to an external device.

The chips 210, 230, 250 and 270 may be semiconductor chips in which integrated circuits such as memory circuits, logic circuits or telecommunication circuits are formed. The chips 210, 230, 250 and 270 may be the same chips that perform substantially the same function. Alternatively, at least one of the chips 210, 230, 250 and 270 may be a different chip from the other chips in terms of function or all the chips 210, 230, 250 and 270 may be different chips from one another in terms of function. The chips 210, 230, 250 and 270 may be attached or adhered to each other by first to fourth adhesive layers 310, 330, 350 and 370 which are disposed between the chips 210, 230, 250 and 270. For example, the package substrate 100 and the first chip 210 may be adhered to each other by the first adhesive layer 310 disposed therebetween, and the first and second chips 210 and 230 may be adhered to each other by the second adhesive layer 330 disposed therebetween. Similarly, the second and third chips 230 and 250 may be adhered to each other by the third adhesive layer 350 disposed therebetween, and the third and fourth chips 250 and 270 may be adhered to each other by the fourth adhesive layer 370 disposed therebetween.

The first chip 210 may be mounted on the package substrate 100 and may have first connectors 211 disposed on edges thereof. In some embodiments, the first connectors 211 may be disposed on edges of the first chip 210 in the form of a chip pad. Connectors such as the first connectors 211 may correspond to terminals to which connection members are electrically connected, and the connection members may correspond to extensions such as redistributed lines (RDLs) that extend electrical paths of the chip pads.

The second chip 230 may be stacked on the first chip 210. The second chip 230 may have second connectors 231 disposed on edges thereof. A portion of at least one of the first connectors 211 may be covered with the second chip 230 stacked on the first chip 210, and the remaining portion of the at least one of the first connectors 211 may be exposed. For example, a portion of each of the first connectors 211 may be covered with the second chip 230, and the remaining portion of each of the first connectors 211 may be exposed. In some embodiments, after the second chip 230 is stacked on the first chip 210, inner half of each of the first connectors 211 may be covered with the second chip 230 and outer half of each of the first connectors 211 may be exposed in terms of size or area.

The second chip 230 may have a smaller size or a narrower width than the first chip 210. When the first connectors 211 are disposed on opposite edges of the first chip 210, at least outer portions of all the first connectors 211 may be exposed. Even though the second chip 230 is smaller or narrower than the first chip 210, the first and second chips 210 and 230 may have the same function. When both the first and second chips 210 and 230 are memory chips, a memory capacity of the first chip 210 may be substantially equal to that of the second chip 230. The second connectors 231 may have a smaller size or a narrower width than the first connectors 211. For example, a width of the second connectors 231 may be substantially half that of the first connectors 211. Further, when a width of the second chip 230 is less than that of the first chip 210, inner half of each of the first connectors 211 may be covered with the second chip 230. As illustrated in FIG. 1, the second chip 230 may be narrower than the first chip 210 such that sidewalls of the second chip 230 are vertically aligned with central points of the first connectors 211 of the first chip 210, and the second connectors 231 having chip pad shapes may be disposed on the edges of the second chip 230 to directly contact the sidewalls of the second chip 230. As a result, outer half portions of the first connectors 211 may be exposed after the second chip 230 is stacked on the first chip 210.

The exposed portions of the first connectors 211 may be electrically connected to the bond fingers 101 though connection members, for example, first metal wires 410. The exposed portions of the first connectors 211 may be covered with first sidewall interconnectors 510, and the first sidewall interconnectors 510 may extend along the sidewalls of the second chip 230 to cover the corresponding second connectors 231. The first sidewall interconnectors 510 may be formed by coating a conductive paste material, and the second connectors 231 may be electrically connected to respective ones of the first connectors 211 through the first sidewall interconnectors 510. Although not shown in the drawings, the first connectors 211 may be insulated from each other by an insulation layer disposed therebetween and the second connectors 231 may also be insulated from each other by an insulation layer disposed therebetween.

The third chip 250 may be stacked on the second chip 230. The third chip 250 may have third connectors 251 disposed on edges thereof. The third chip 250 may be substantially the same chip as the first chip 210 in terms of size. That is, the third chip 250 may be attached to the second chip 230 such that sidewalls of the third chip 250 are vertically aligned with the corresponding sidewalls of the first chip 210. As a result, edges of the second chip 250 may laterally protrude from the sidewalls of the second chip 230. Accordingly, a gap region may be provided between the edges of the first chip 210 and the edges of the third chip 250, and the gap region may provide a space in which the first metal wires 410 can be stably and safely disposed. That is, the gap region may prevent the first metal wires 410 from contacting a bottom surface of the third chip 250. As such, there is no need to additionally introduce spacers (not shown) into regions between the chips 210, 230 and 250 in order to obtain a marginal empty space in which the first metal wires 410 are disposed. As a result, a thickness of the stack package 10 may be minimized.

The fourth chip 270 may be stacked on the third chip 250. The fourth chip 270 may have a smaller size or a narrower width than the third chip 250. Even though the fourth chip 270 is smaller or narrower than the third chip 250, the third and fourth chips 250 and 270 may have the same function. When both the third and fourth chips 250 and 270 are memory chips, a memory capacity of the third chip 250 may be substantially equal to that of the fourth chip 270. The fourth chip 270 may be substantially the same chip as the second chip 230 in terms of size. That is, the fourth chip 270 may be attached to the third chip 250 such that sidewalls of the fourth chip 270 are vertically aligned with the corresponding sidewalls of the second chip 230. The fourth chip 270 may have fourth connectors 271 disposed on edges thereof. The fourth chip 270 may be stacked on the third chip 250 such that at least outer portions of the third connectors 251 are exposed. The exposed portions of the third connectors 251 may be electrically connected to the bond fingers 101 though connection members, for example, second metal wires 450. At least one of the first metal wires 410 and at least one of the second metal wires 450 may be electrically connected to one of the bond fingers 101. Alternatively, the first metal wires 410 may be electrically connected to first bond fingers of the bond fingers 101, and the second metal wires 450 may be electrically connected to second bond fingers of the bond fingers 101.

The exposed portions of the third connectors 251 may be covered with second sidewall interconnectors 550, and the second sidewall interconnectors 550 may extend along the sidewalls of the fourth chip 270 to cover the corresponding fourth connectors 271. Thus, the fourth connectors 271 may be electrically connected to respective ones of the third connectors 251 through the second sidewall interconnectors 550. The first sidewall interconnectors 510 may surround first end portions 419 of the first metal wires 410 and may fix the first end portions 419 of the first metal wires 410 to the first connectors 211. Similarly, the second sidewall interconnectors 550 may surround first end portions 419 of the second metal wires 450 and may fix the first end portions 419 of the second metal wires 450 to the third connectors 251. In such a case, the first and second sidewall interconnectors 510 and 550 may prevent the first and second metal wires 410 and 450 from being deformed or lifted from the first and third connectors 211 and 251 in a subsequent molding process for forming a protection layer 600. Alternatively, the first sidewall interconnectors 510 may be connected to the first connectors 211 without surrounding the first end portions 419 of the first metal wires 410, and the second sidewall interconnectors 550 may be connected to the third connectors 251 without surrounding the first end portions 419 of the second metal wires 450.

Figure 2:
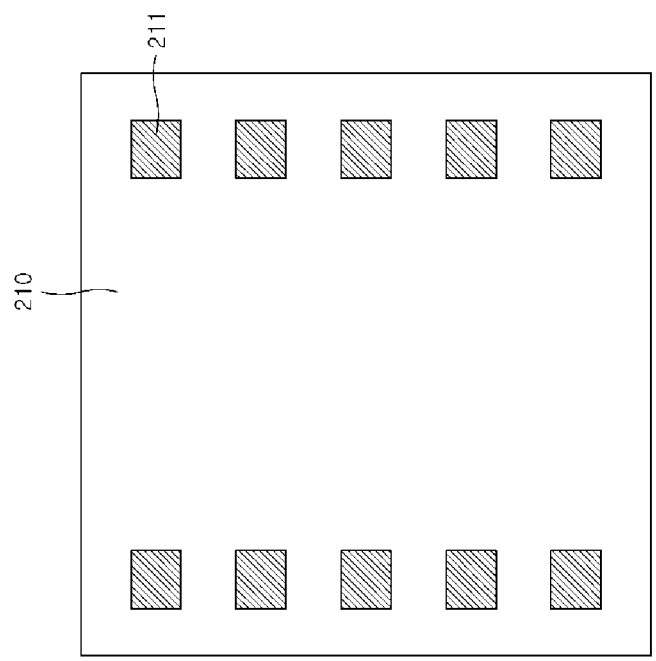

FIG. 2 is a plan view illustrating the first chip 210 of FIG. 1. Referring to FIG. 2, the first chip 210 is provided. The first connectors 211 of the first chip 210 may be disposed on the opposite edges of the first chip 210. That is, the first connectors 211 may include edge-type chip pads which are arrayed on the opposite edges of the first chip 210.

Figure 3:
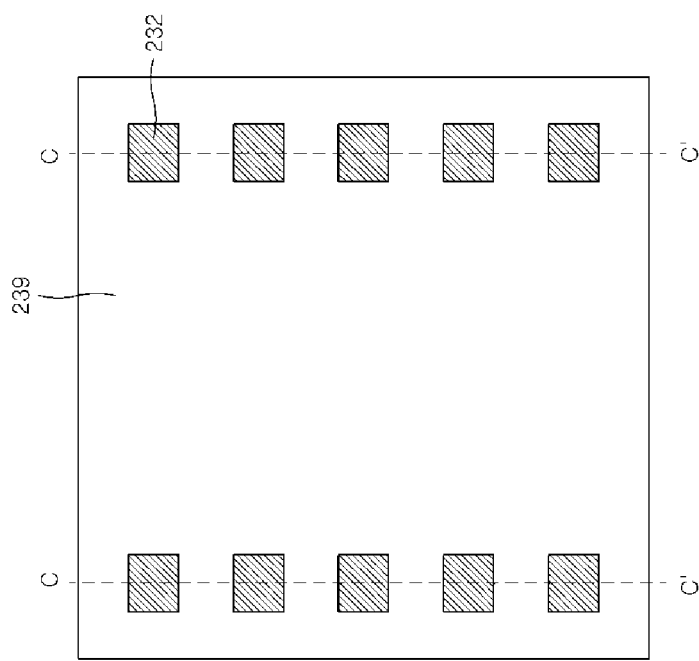

FIG. 3 is a plan view illustrating a preliminary second chip 239 for forming the second chip 230 shown in FIG. 1. Referring to FIG. 3, the preliminary second chip 239 may be provided. The preliminary second chip 239 may have preliminary second connectors 232 which are disposed on the opposite edges of the preliminary second chip 239. The preliminary second chip 239 may be substantially the same chip as the first chip 210 in terms of function and size. Alternatively, the preliminary second chip 239 may be a different chip from the first chip 210 in terms of function. The preliminary second connectors 232 may also include edge-type chip pads which are arrayed on the opposite edges of the preliminary second chip 239.

Figure 4:
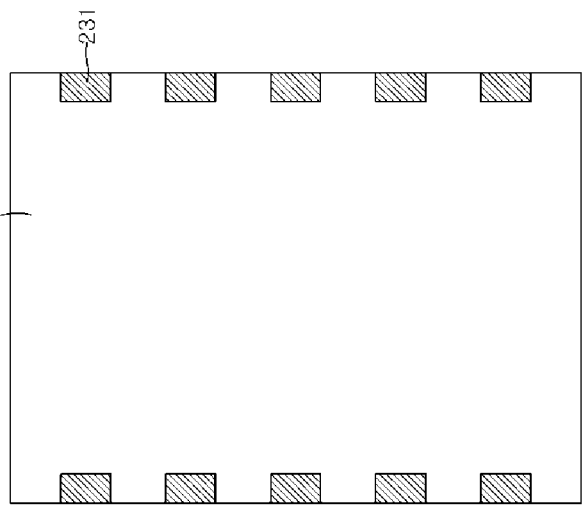

FIG. 4 is a plan view illustrating the second chip 230 shown in FIG. 1. Referring to FIGS. 3 and 4, the preliminary second chip 239 may be cut along lines C-C' which are adjacent to opposite sidewalls thereof to pass through central points of the preliminary second connectors 232, thereby forming the second chip 230 having a reduced width as compared with the preliminary second chip 239. Accordingly, outer half portions of the preliminary second connectors 232 may be removed from the second chip 230, and the second chip 230 may include inner half portions of the preliminary second connectors 232. The inner half portions of the preliminary second connectors 232 may correspond to the second connectors 231 of the second chip 230. As a result, the second connectors 231 may be arrayed on the opposite edges of the second chip 230 to directly contact opposite sidewalls of the second chip 230, as illustrated in FIG. 4.

Figure 5:
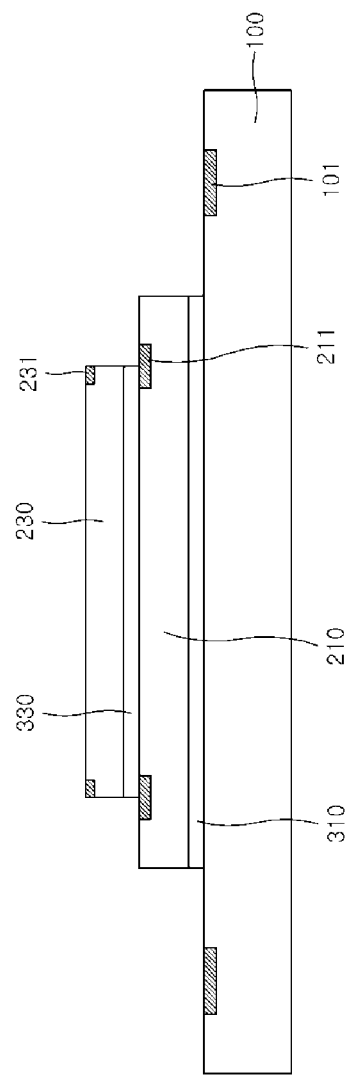

Referring to FIG. 5, the first chip 210 shown in FIG. 2 may be attached to a surface of the package substrate 100 including the bond fingers 101 using a first adhesive layer 310. Subsequently, the second chip 230 shown in FIG. 4 may be attached to a surface of the first chip 210 using a second adhesive layer 330. The second chip 230 may be aligned with and stacked on the first chip 210 such that outer portions (substantially, outer half portions) of the first connectors 211 are exposed. When a distance between the second connectors 231 is equal to a distance between the first connectors 211, the second connectors 231 of the second chip 230 may be aligned to overlap with respective ones of the inner portions of the first connectors 211 covered with the second chip 230. Thus, the second chip 230 may be stacked on the first chip 210 such that the second connectors 231 are directly adjacent to respective ones of exposed outer portions 212 of the first connector 211, as illustrated in the plan view of FIG. 6.

Figure 7:
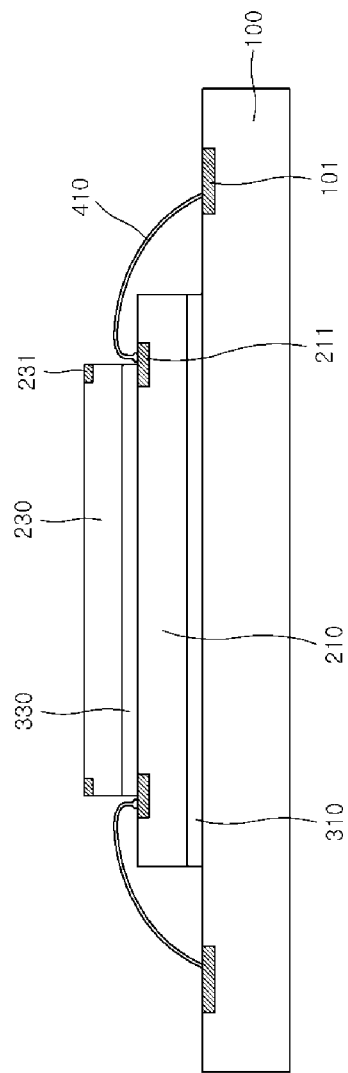
Figure 8:
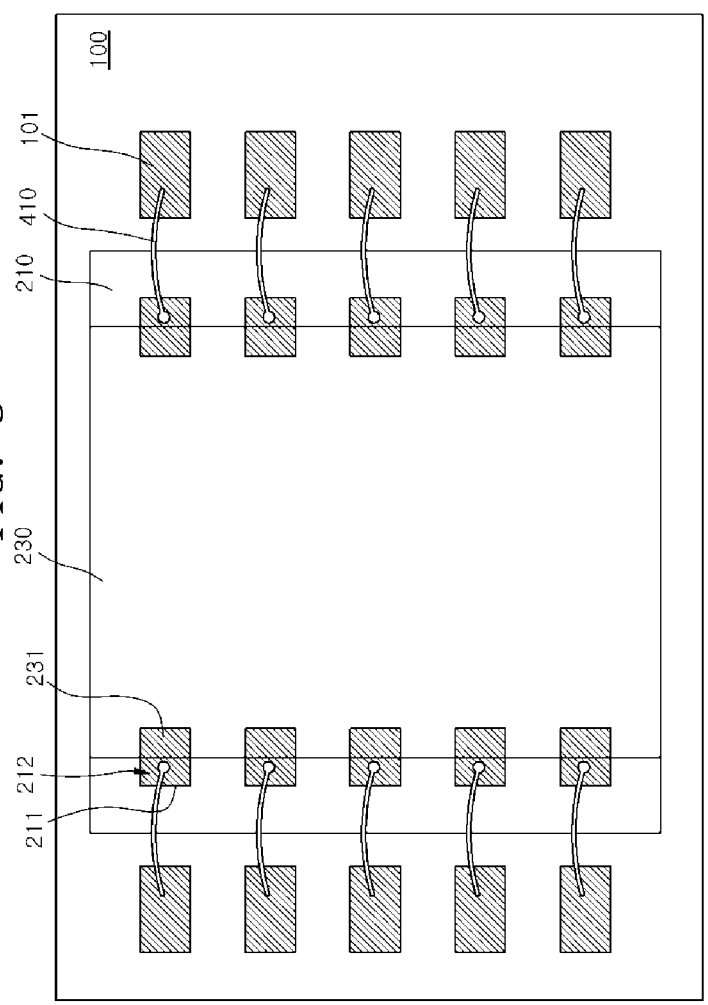

Referring to FIGS. 7 and 8, the exposed outer portions 212 of the first connector 211 may be electrically connected to respective ones of the bond fingers 101 using the first metal wires 410. The first metal wires 410 may be formed using a wire bonding process that produces, for example, a gold wire. Thus, the first chip 210 may be electrically connected to the bond fingers 101 of the package substrate 100 through the first metal wires 410. The first metal wires 410 may be formed before or after the second chip 230 is stacked on the first chip 210.

Figure 9:
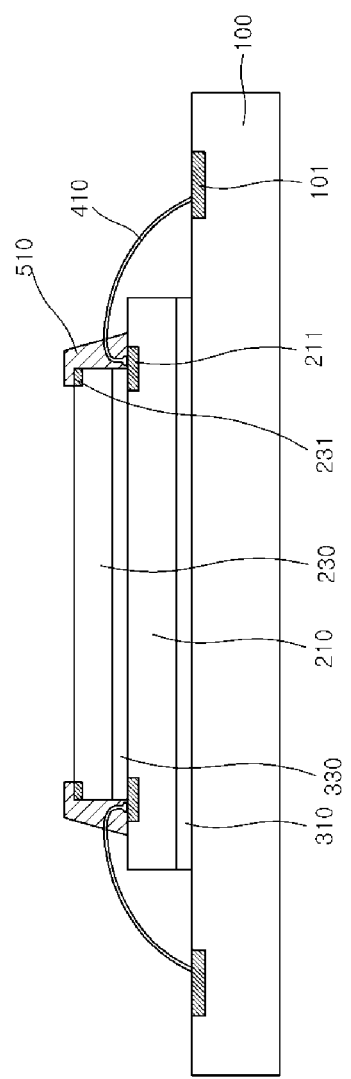
Figure 10:
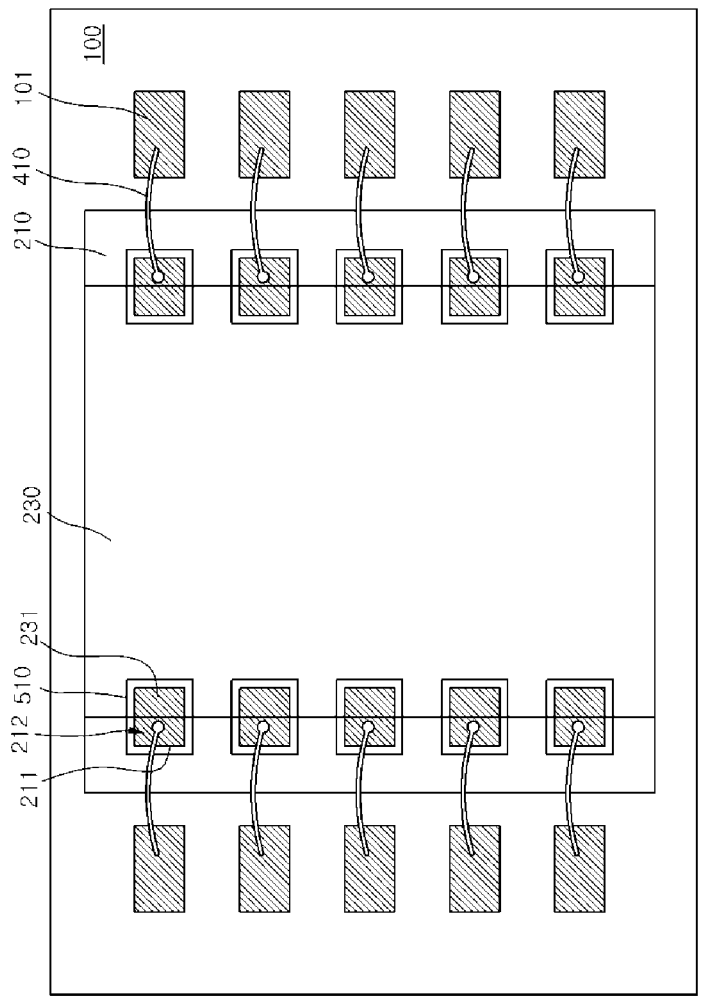

Referring to FIGS. 9 and 10, the first sidewall interconnectors 510 may be formed to electrically connect the exposed portions 212 of the first connectors 211 to respective ones of the second connectors 231. The first sidewall interconnectors 510 may be formed by coating a conductive paste material on the exposed portions 212 of the first connectors 211, by extending the conductive paste material onto the sidewalls of the second chip 230, and by additionally extending the conductive paste material to cover the second connectors 231. In such a case, the first sidewall interconnectors 510 may be coated to surround and fix the end portions of the first metal wires 410. In the event that the first metal wires 410 are fixed to the first connectors 211 by the first sidewall interconnectors 510, the first sidewall interconnectors 510 may prevent the first metal wires 410 from being deformed or lifted from the first connectors 211 due to flow of an epoxy molding compound (EMC) material during a subsequent molding process for forming a protection layer 600. In some embodiments, the first sidewall interconnectors 510 may be coated to be merely connected to the first connectors 211 without surrounding the end portions of the first metal wires 410. Although FIGS. 9 and 10 illustrate an example that the first sidewall interconnectors 510 are formed after the second chip 230 is stacked on the first chip 210, the inventive concept is not limited thereto. For example, after an additional upper chip (not shown) having substantially the same shape as the second chip 230 is stacked on the second chip 230, the first sidewall interconnectors 510 may be formed to electrically connect the first and second chips 210 and 230 to the additional upper chip.

Figure 11:
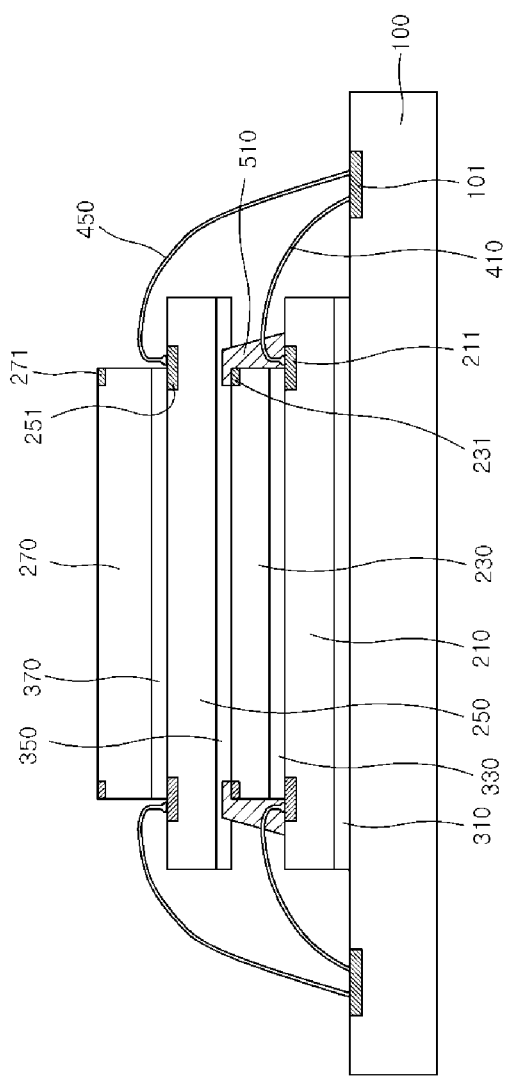

Referring to FIG. 11, the third chip 250 may be adhered to or stacked on the second chip 230 using a third adhesive layer 350. The third adhesive layer 350 may be introduced to cover the first sidewall interconnectors 510 on the second connectors 231. The third chip 250 may be a different chip from the first or second chip 210 or 230 in terms of function. Alternatively, the third chip 250 may be substantially the same chip as the first chip 210 illustrated in FIG. 2 in terms of chip size and connectors' array. In particular, when the stack package 10 includes a plurality of stacked memory chips, the third chip 250 may be substantially the same chip as the first chip 210 in terms of chip size and connectors' array. Thus, the third chip 250 may be stacked on the second chip 230 such that sidewalls of the third chip 250 are vertically aligned with sidewalls of the first chip 210. In such a case, edges of the third chip 250 having the third connectors 251 may laterally protrude from sidewalls of the second chip 230 to form overhangs. Accordingly, a gap region may be provided between the edges of the third chip 250 and the edges of the first chip 210. The gap region may provide a space in which the first metal wires 410 can be stably and safely connected to the first connectors 211. That is, the gap region may prevent the first metal wires 410 from contacting a bottom surface of the third chip 250. The gap region may be provided due to the presence of the second chip 230 between the first and third chips 210 and 250. Thus, there is no need to additionally introduce spacers (not shown) into regions between the chips 210, 230 and 250 in order to obtain a marginal empty space in which the first metal wires 410 are disposed. Accordingly, a thickness of the stack package 10 may be minimized because the chips 210, 230 and 250 can be stacked without use of any spacers.

Figure 6:
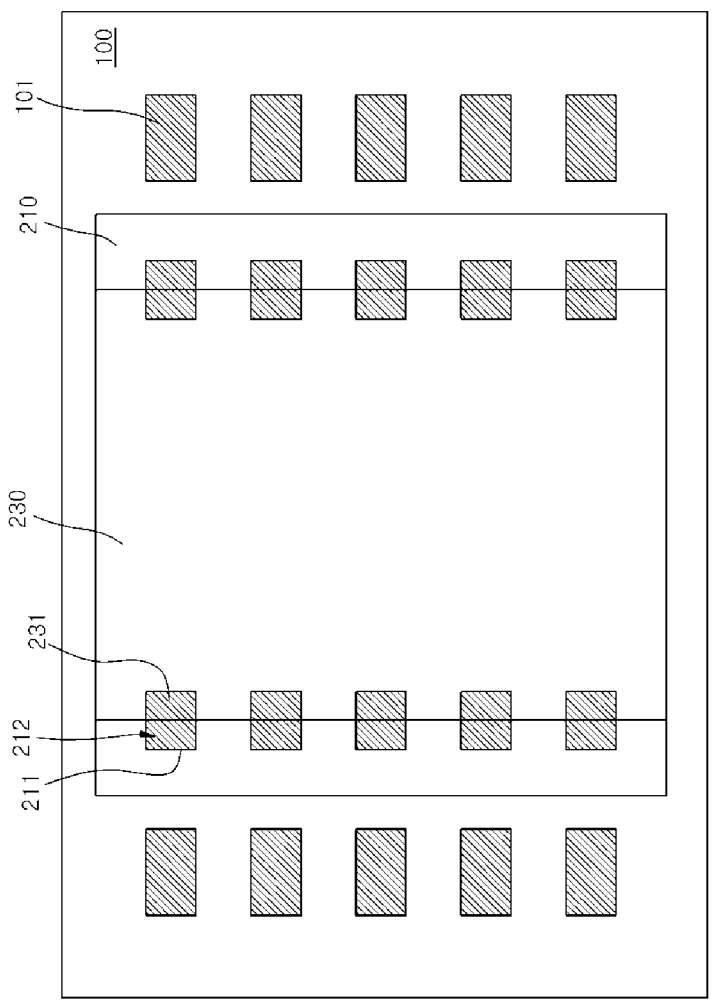

Referring still to FIG. 11, the fourth chip 270 may be adhered to or stacked on the third chip 250 using a fourth adhesive layer 370. The fourth chip 270 may be stacked on the third chip 250 using the same manners as described with reference to FIGS. 5 and 6 illustrating a method of stacking the second chip 230 on the first chip 210. Further, the fourth chip 270 may be provided using the same manners as described with reference to FIGS. 3 and 4 illustrating a method of providing the second chip 230. Even though the fourth chip 270 is different from the other chips 210, 230 and 250 in terms of function, the fourth chip 270 may have substantially the same chip size and connectors' array as the second chip 230. That is, the fourth chip 270 may be provided to have substantially the same shape as the second chip 230. Thus, outer portions of the third connectors 251 of the third chip 250 may be exposed even after the fourth chip 270 is stacked on the third chip 250.

Second metal wires 450 may be formed to electrically connect the exposed outer portions of the third connectors 251 to the bond fingers 101 of the package substrate 100. The second metal wires 450 may be formed using the same manners as described with reference to FIGS. 7 and 8 illustrating a method of forming the first metal wires 410. As a result, the exposed outer portions of the third connectors 251 may be electrically connected to the package substrate 100 through the second metal wires 450. During formation of the second metal wires 450, the first sidewall interconnectors 510 may support the overhangs of the third chip 250 to suppress a bouncing phenomenon of the third chip 250.

Figure 12:
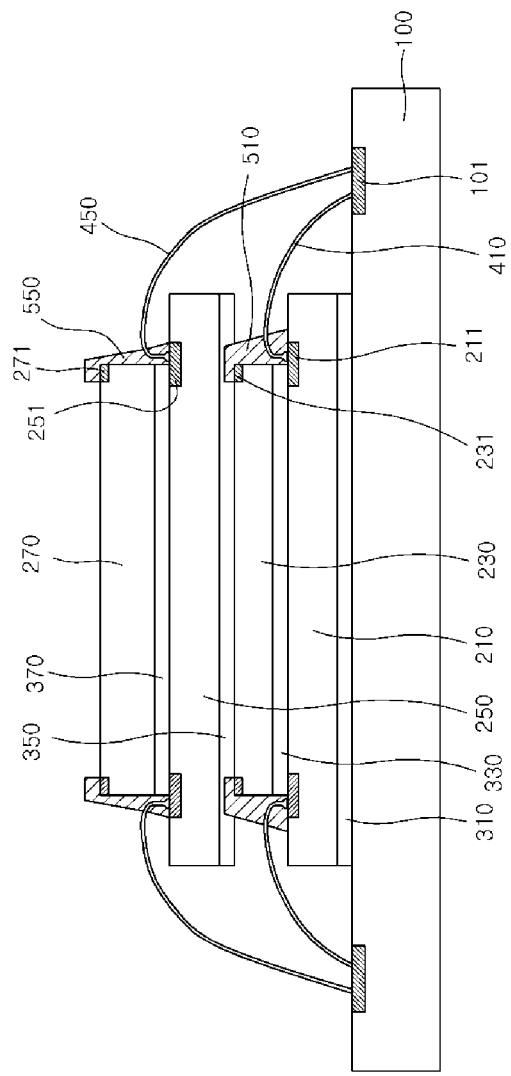

Referring to FIG. 12, the second sidewall interconnectors 550 may be formed to electrically connect the exposed portions of the third connectors 251 to the fourth connectors 271. The second sidewall interconnectors 550 may be formed by coating a conductive paste material on the exposed portions of the third connectors 251, by extending the conductive paste material onto the sidewalls of the fourth chip 270, and by additionally extending the conductive paste material to cover the fourth connectors 271. The second sidewall interconnectors 550 may be formed using the same manners as described with reference to FIGS. 9 and 10 illustrating a method of forming the first sidewall interconnectors 510. The method of stacking the third and fourth chips 250 and 270 may be substantially the same as the method of stacking the first and second chips 210 and 230, as described above. In some embodiments, additional chips may be stacked on the fourth chip 270 using the method of stacking the first and second chips 210 and 230. As described above, a plurality of chips may be stacked on the package substrate 100. Nevertheless, a planar area that the plurality of chips occupy may be substantially equal to a planar area of the first chip 210 due to a connection structure including the first and second metal wires 410 and 450 and the first and second sidewall interconnectors 510 and 550. Thus, a size or a planar area of the stack package (10 of FIG. 1) may be minimized. Further, a plurality of chips may be stacked on the package substrate 100 without the use of any spacers. Thus, a thickness of the stack package 10 may be minimized. As a result, a small and compact stack package may be realized.

A protection layer (600 of FIG. 1) covering the stacked chips 210, 230, 250 and 270 may be formed of a dielectric material, for example, an epoxy molding compound (EMC) material using a molding process, thereby completely realizing the stack package 10. Although FIGS. 1 to 12 illustrate an example that the connectors 211, 231, 251 and 271 are chip pads, the inventive concept is not limited thereto. For example, the connectors 211, 231, 251 and 271 may be replaced with redistributed lines (RDLs) extending from chip pads which are disposed at central regions of the chips.

Figure 13:
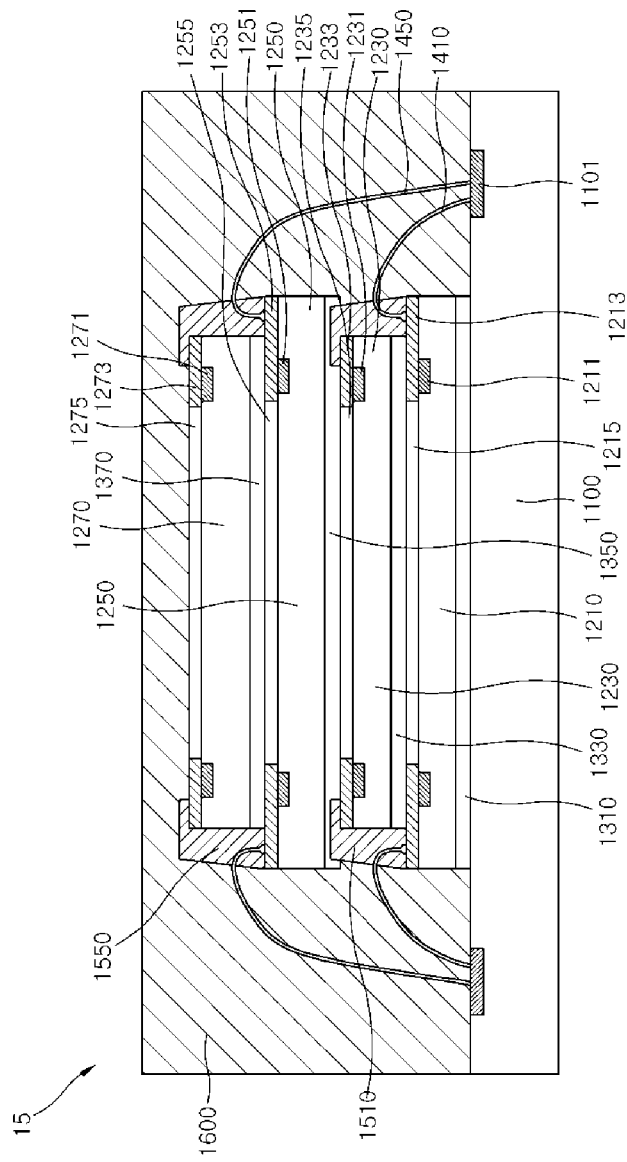
FIGS. 13 to 16 illustrate a stack package and a method of manufacturing a stack package according to an embodiment of the inventive concept.

Referring to FIG. 13, a stack package 15 according to an embodiment may include a package substrate 1100 and first to fourth chips 1210, 1230, 1250 and 1270 sequentially stacked on a surface of the package substrate 1100. The package substrate 1100 may include connection terminals such as bond fingers 1101 which are electrically connected to the first to fourth chips 1210, 1230, 1250 and 1270. The first to fourth chips 1210, 1230, 1250 and 1270 may be sequentially attached to the package substrate 1100 using first fourth adhesive layers 1310, 1330, 1350 and 1370.

The first chip 1210 may have first connectors 1211 and 1213 disposed on opposite edges thereof. The first connectors 1211 and 1213 may include first chip pads 1211 arrayed on the opposite edges of the first chip 1210, first extensions 1213 electrically connected to respective ones of the first chip pads 1211, and a first insulation layer 1215 disposed on a top surface of the first chip 1210. The first insulation layer 1215 may be formed to expose the first extensions 1213. The first extensions 1213 may correspond to redistributed lines that contact respective ones of the first chip pads 1211 and extend onto upper corners of the first chip 1210. In some embodiments, the first chip pads 1211 may be disposed on a central region of the first chip 1210 or may be randomly disposed on the first chip 1210. Even in such a case, the first extensions 1213 may contact respective ones of the first chip pads 1211 and may extend onto the upper corners of the first chip 1210.

The second chip 1230 may have second connectors 1231 and 1233 disposed on opposite edges thereof. The second connectors 1231 and 1233 may include second chip pads 1231 arrayed on the opposite edges of the second chip 1230, second extensions 1233 electrically connected to respective ones of the second chip pads 1231, and a second insulation layer 1235 disposed on a top surface of the second chip 1230. The second insulation layer 1235 may be formed to expose the second extensions 1233. The second extensions 1233 may correspond to redistributed lines that contact respective ones of the second chip pads 1231 and extend onto upper corners of the second chip 1230. In some embodiments, the second chip pads 1231 may be disposed on a central region of the first chip 1210 or may be randomly disposed on the second chip 1230. Even in such a case, the second extensions 1233 may contact respective ones of the second chip pads 1231 and may extend onto the upper corners of the second chip 1230.

The third chip 1250 may have third connectors 1251 and 1253 disposed on opposite edges thereof. The third connectors 1251 and 1253 may include third chip pads 1251 arrayed on the opposite edges of the third chip 1250, third extensions 1253 electrically connected to respective ones of the third chip pads 1251, and a third insulation layer 1255 disposed on a top surface of the third chip 1250.

The fourth chip 1270 may have fourth connectors 1271 and 1273 disposed on opposite edges thereof. The fourth connectors 1271 and 1273 may include fourth chip pads 1271 arrayed on the opposite edges of the fourth chip 1270, fourth extensions 1273 electrically connected to respective ones of the fourth chip pads 1271, and a fourth insulation layer 1275 disposed on a top surface of the fourth chip 1270.

The third chip 1250 may have substantially the same shape as the first chip 1210, and the fourth chip 1270 may have substantially the same shape as the second chip 1230. That is, the first and third chips 1210 and 1250 may have the same width, and the second and fourth chips 1230 and 1270 may also have the same width. Further, the width of the first and third chips 1210 and 1250 may be greater than that of the second and fourth chips 1230 and 1270. Thus, if sidewalls of the third chip 1250 are vertically aligned with sidewalls of the first chip 1210 and sidewalls of the fourth chip 1270 are vertically aligned with sidewalls of the second chip 1230, edges of the first and third chips 1210 and 1250 may laterally protrude from the sidewalls of the second chip 1230. As a result, a gap region may be provided between the edges of the first chip 1210 and the edges (i.e., overhangs) of the third chip 1250.

After the second chip 1230 is stacked on the first chip 1210, outer ends of the first extensions 1213 may be exposed. The second extensions 1233 of the second chip 1230 may be shorter than the first extensions 1213 when viewed from a plan view.

The exposed outer ends of the first extensions 1213 may be electrically connected to the bond fingers 1101 though connection members, for example, first metal wires 1410. The exposed outer ends of the first extensions 1213 may be covered with first sidewall interconnectors 1510, and the first sidewall interconnectors 1510 may extend along the sidewalls of the second chip 1230 to cover outer ends of the second extensions 1233. The first sidewall interconnectors 1510 may be formed by coating a conductive paste material, and the second extensions 1233 may be electrically connected to respective ones of the first extensions 1213 through the first sidewall interconnectors 1510.

The third chip 1250 may be stacked on the second chip 1230. The third chip 1250 may be attached to the second chip 1230 such that the sidewalls of the third chip 1250 are vertically aligned with the sidewalls of the first chip 1210. Thus, the edges of the third chip 1250 may laterally protrude from the sidewalls of the second chip 1230. The fourth chip 1270 may be stacked on the third chip 1250. The fourth chip 1270 may be stacked on the third chip 1250 to expose outer ends of the third extensions 1253. Second metal wires 1450 may be formed to electrically connect the exposed outer ends of the third extensions 1253 to the bond fingers 1101. The exposed outer ends of the third extensions 1253 may be covered with second sidewall interconnectors 1550, and the second sidewall interconnectors 1550 may extend along the sidewalls of the fourth chip 1270 to cover the fourth extensions 1273. A method of forming the second sidewall interconnectors 1550 may be the same as the method of forming the first sidewall interconnectors 1510. The first sidewall interconnectors 1510 may surround first end portions of the first metal wires 1410 and may fix the first end portions of the first metal wires 1410 to the first extensions 1213. Similarly, the second sidewall interconnectors 1550 may surround first end portions of the second metal wires 1450 and may fix the first end portions of the second metal wires 1450 to the third extensions 1253. Alternatively, the first sidewall interconnectors 1510 may be connected to the first extensions 1213 without surrounding the first end portions of the first metal wires 1410, and the second sidewall interconnectors 1550 may be connected to the third extensions 1253 without surrounding the first end portions of the second metal wires 1450.

Figure 14:
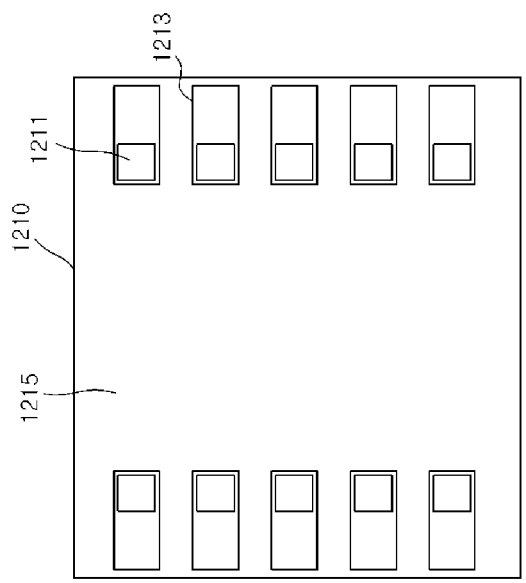

FIG. 14 is a plan view illustrating the first chip 1210 of FIG. 13. Referring to FIG. 14, the first chip 1210 may be provided. The first connectors 1211 and 1213 of the first chip 1210 may be disposed on the opposite edges of the first chip 1210. That is, the first connectors 1211 and 1213 may include edge-type first chip pads 1211 which are arrayed on the opposite edges of the first chip 1210, as described with reference to FIG. 2. The first extensions 1213 electrically connected to the first chip pads 1211 and the first insulation layer 1215 disposed on the first chip 1210 to expose the first chip pads 1211 may be formed using a process of forming redistributed lines (RDLs). The first insulation layer 1215 may be formed to electrically insulate the first extensions 1213 from each other. The first extensions 1213 may be electrically connected to the first chip pads 1211 and may be formed of conductive lines that extend onto upper corners of the first chip 1210.

Figure 15:
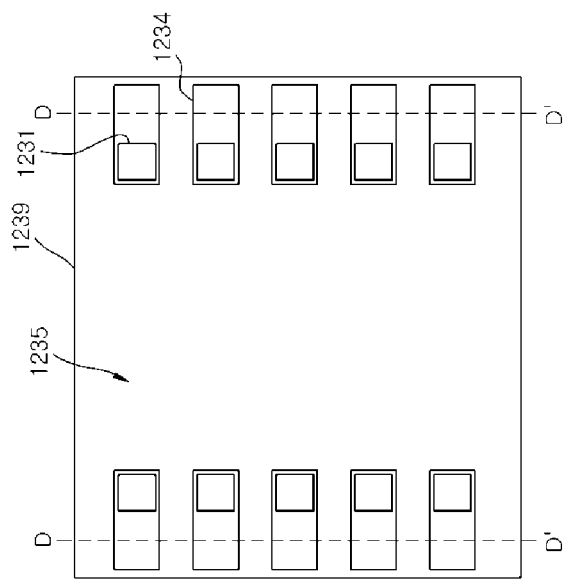

FIG. 15 is a plan view illustrating a preliminary second chip 1239 for forming the second chip 1230 shown in FIG. 13. Referring to FIG. 15, the preliminary second chip 1239 may be provided. The preliminary second chip 1239 may have preliminary second connectors 1231 and 1234 disposed on opposite to edges thereof. The preliminary second connectors 1231 and 1234 may include edge-type second chip pads 1231 and preliminary second extensions 1234 electrically connected to the edge-type second chip pads 1231 to extend onto upper corners of the preliminary second chip 1239. The preliminary second extensions 1234 may be formed of redistributed lines (RDLs). The second insulation layer 1235 be formed to insulate the preliminary second extensions 1234 from each other and to expose the preliminary second extensions 1234.

Figure 16:
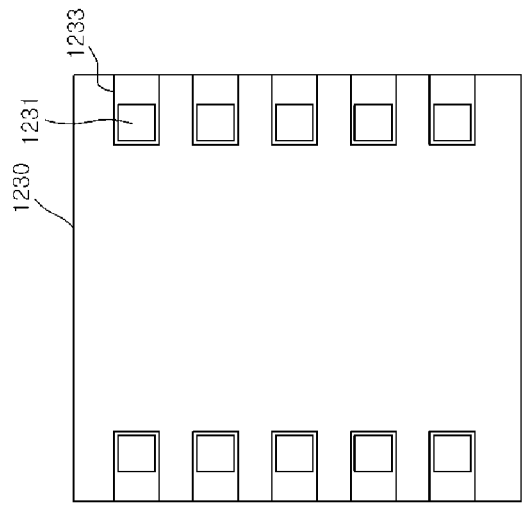

FIG. 16 is a plan view illustrating the second chip 1230 shown in FIG. 13. Referring to FIGS. 15 and 16, the preliminary second chip 1239 may be cut along lines D-D' which are adjacent to opposite sidewalls thereof to cross the preliminary second extensions 1234, thereby forming the second chip 1230 having a reduced width as compared with the preliminary second chip 1239. Accordingly, outer ends of the preliminary second extensions 1234 may be removed from the second chip 1230, and the second chip 1230 may include inner portions of the preliminary second extensions 1234. The inner portions of the preliminary second extensions 1234 may correspond to the second extensions 1233 of the second chip 1230. As a result, the second connectors may be formed to include the second chip pads 1231 and the second extensions 1233 (corresponding to the inner portions of the preliminary second extensions 1234).

The first chip 1210 shown in FIG. 14 and the second chip 1230 shown in FIG. 16 may be sequentially stacked on the package substrate 1100 to form the stack package 15 of FIG. 13. After the first and second chips 1210 and 1230 are stacked, the first metal wires (1410 of FIG. 13) and the first sidewall interconnectors (1510 of FIG. 13) may be formed to electrically connect the first extensions 1213, the second extensions 1233 and the bond fingers 1101 to each other. Subsequently, the third chip (1250 of FIG. 13) and the fourth chip (1270 of FIG. 13) may be sequentially stacked on the second chip 1230, and the second metal wires (1450 of FIG. 13) and the second sidewall interconnectors (1550 of FIG. 13) may be formed to electrically connect the third extensions 1253, the fourth extensions 1273 and the bond fingers 1101 to each other.

Figure 17:
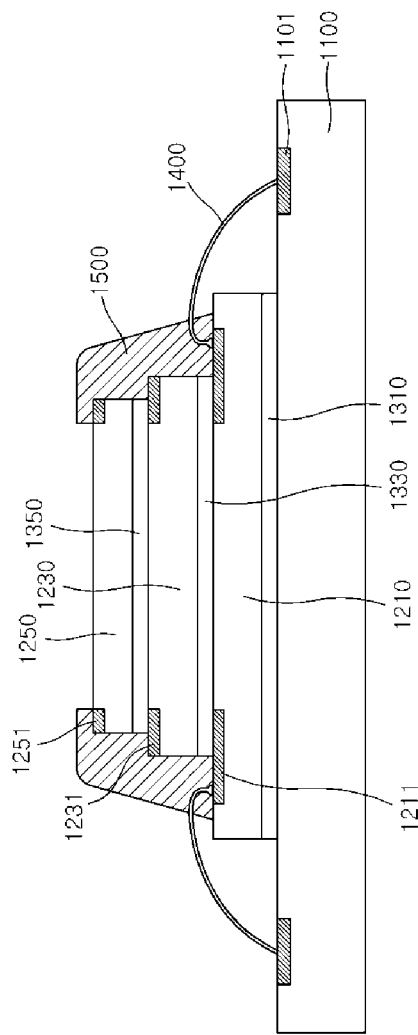
FIG. 17 is a cross sectional view illustrating a stack package according to an embodiment of the inventive concept.

Referring to FIG. 17, a stack package according to other embodiments may be fabricated by attaching a first chip 1210 to a surface of a package substrate 1100 having bond fingers 1101 using a first adhesive layer 1310. The first chip 1210 may include first connectors 1211 disposed on edges thereof. A second chip 1230 may be stacked on a surface of the first chip 1210 opposite to the package substrate 1100 using a second adhesive layer 1330. The second chip 1230 may include second connectors 1231 disposed on edges thereof. The second chip 1230 may be stacked on the first chip 1210 such that outer portions of the first connectors 1211 are exposed. A third chip 1250 may be stacked on the second chip 1230 using a third adhesive layer 1350. The third chip 1250 may include third connectors 1251 disposed on edges thereof. The third chip 1250 may be stacked on the second chip 1230 such that outer portions of the second connectors 1231 are exposed.

The exposed outer portions of the first connectors 1211 may be electrically connected to the bond fingers 1101 through metal wires 1400. Sidewall interconnectors 1500 may be formed to cover the exposed outer portions of the first connectors 1211, and the sidewall interconnectors 1500 may extend along sidewalls of the second and third chips 1230 and 1250 to cover the exposed outer portions of the second connectors 1231 and the third connectors 1251 of the third chip 1250. Accordingly, the sidewall interconnectors 1500 may be formed to electrically connect the first connectors 1211, the second connectors 1231 and the third connectors 1251 to each other.

The first connectors 1211 may be disposed to be spaced apart from sidewalls of the first chip 1210. The second connectors 1231 may be disposed to directly contact the sidewalls of the second chip 1230. The third connectors 1251 may also be disposed to directly contact the sidewalls of the third chip 1250. When viewed form a cross sectional view of FIG. 17, the second connectors 1231 may be narrower than the first connectors 1211 and the third connectors 1251 may be narrower than the second connectors 1231.

Figure 18:
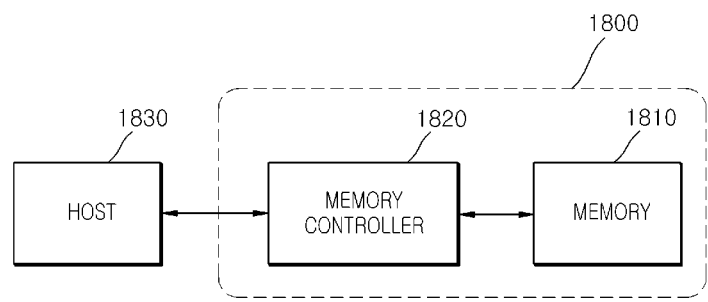
FIG. 18 is a block diagram illustrating an example of an electronic system including a stack package in accordance with an embodiment of the inventive concept.

Referring to FIG. 18, the stack package in accordance with the embodiments may be provided in the form of a memory card 1800. For example, the memory card 1800 may include a memory 1810 such as a nonvolatile memory device and a memory controller 1820. The memory 1810 and the memory controller 1820 may store data or read stored data.

The memory 1810 may include at least any one among nonvolatile memory devices to which the packaging technology of the embodiments of the present invention is applied. The memory controller 1820 may control the memory 1810 such that stored data is read out or data is stored in response to a read/write request from a host 1830.

Figure 19:
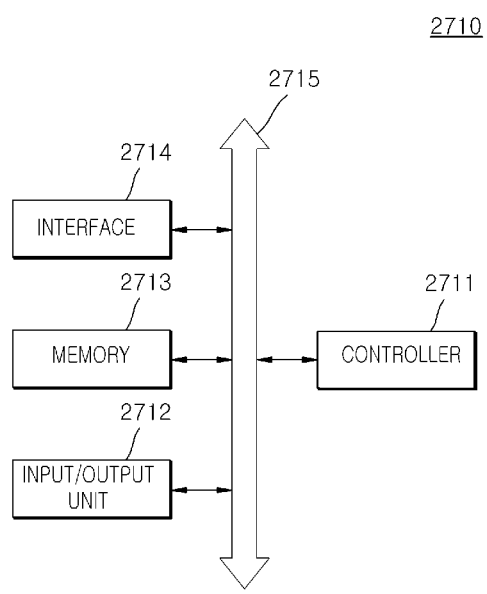
FIG. 19 is a block diagram illustrating an example of an electronic system including a stack package in accordance with an embodiment of the inventive concept.

Referring to FIG. 19, the stack package in accordance with an embodiment may be applied to an electronic system 2710. The electronic system 2710 may include a controller 2711, an input/output unit 2712, and a memory 2713. The controller 2711, the input/output unit 2712 and the memory 2713 may be coupled with one another through a bus 2715 providing a path through which data move.

For example, the controller 2711 may include at least any one of at least one microprocessor, at least one digital signal processor, at least one microcontroller, and logic devices capable of performing the same functions as these components. The controller 2711 and the memory 2713 may include at least any one of the flexible stack packages according to the embodiments of the present invention. The input/output unit 2712 may include at least one selected among a keypad, a keyboard, a display device, a touch screen and so forth. The memory 2713 is a device for storing data. The memory 2713 may store data and/or commands to be executed by the controller 2711, and the likes.

The memory 2713 may include a volatile memory device such as a DRAM and/or a nonvolatile memory device such as a flash memory. For example, a flash memory may be mounted to an information processing system such as a mobile terminal or a desk top computer. The flash memory may constitute a solid state disk (SSD). In this case, the electronic system 2710 may stably store a large amount of data in a flash memory system.

The electronic system 2710 may further include an interface 2714 configured to transmit and receive data to and from a communication network. The interface 2714 may be a wired or wireless type. For example, the interface 2714 may include an antenna or a wired or wireless transceiver.

The electronic system 2710 may be realized as a mobile system, a personal computer, an industrial computer or a logic system performing various functions. For example, the mobile system may be any one of a personal digital assistant (PDA), a portable computer, a tablet computer, a mobile phone, a smart phone, a wireless phone, a laptop computer, a memory card, a digital music system and an information transmission/reception system.

In the case where the electronic system 2710 is an equipment capable of performing wireless communication, the electronic system 2710 may be used in a communication system such as of CDMA (code division multiple access), GSM (global system for mobile communications), NADC (north American digital cellular), E-TDMA (enhanced-time division multiple access), WCDAM (wideband code division multiple access), CDMA2000, LTE (long term evolution) and Wibro (wireless broadband Internet).

The embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A stack package comprising:
   a substrate having bond fingers;
   a first chip on the substrate, the first chip having first connectors on edges thereof;
   a second chip stacked on the first chip to expose outer portions of the first connectors, the second chip having second connectors on edges thereof;
   a third chip stacked on the second chip to expose outer portions of the second connectors, the third chip having third connectors on edges thereof;
   metal wires to electrically connect the exposed outer portions of the first connectors to the bond fingers; and
   sidewall interconnectors to electrically connect the exposed outer portions of the first connectors to the second connectors and the third connectors
   wherein a portion of the sidewall interconnectors surround a first end portion of the metal wires.

2. The stack package of claim 1, wherein the second connectors are disposed on opposite edges of the second chip.

3. The stack package of claim 1, wherein the first, second and third chips have substantially the same function.

4. The stack package of claim 1, wherein the first, second and third chips are memory chips having substantially the same memory capacity.

5. The stack package of claim 4, wherein the third chip is smaller in size than the second chip and the second chip is smaller in size than the first chip.

6. The stack package of claim 1, wherein the second connectors extend onto upper corners of the second chip to contact sidewalls of the second chip.

7. The stack package of claim 1, wherein each of the second connectors includes:
   a chip pad on a top surface of the second chip; and
   an extension connected to the chip pad, the extension extending onto an upper corner of the second chip to contact a sidewall of the second chip,
   wherein the third connectors extend onto upper corners of the third chip to contact sidewalls of the third chip.

8. The stack package of claim 7, wherein each of the third connectors includes:
   a chip pad on a top surface of the third chip; and
   an extension connected to the chip pad,
   wherein the extension extends onto an upper corner of the third chip to contact a sidewall of the third chip.

9. The stack package of claim 1:
   wherein the second connectors are narrower than the first connectors; and
   wherein the third connectors are narrower than the second connectors.

* * * * *